(12) United States Patent  
Wallner et al.

(10) Patent No.: US 8,770,017 B2  
(45) Date of Patent: Jul. 8, 2014

(54) METHOD OF MANUFACTURING A MOLDED SENSOR SUBASSEMBLY

(71) Applicant: ZF Friedrichshafen AG, Friedrichshafen (DE)

(72) Inventors: Herbert Wallner, Auerbach (DE); Roland Friedl, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 53 days.

(21) Appl. No.: 13/685,806

(22) Filed: Nov. 27, 2012

(65) Prior Publication Data  
US 2013/0133412 A1 May 30, 2013

(30) Foreign Application Priority Data  
Nov. 29, 2011 (DE) .......................... 10 2011 087 328

(51) Int. Cl.  
*G01M 13/02* (2006.01)  
*H05K 3/28* (2006.01)

(52) U.S. Cl.  
CPC ...... *H05K 3/284* (2013.01); *H05K 2201/10303* (2013.01); *H05K 2203/1316* (2013.01); *G01M 13/02* (2013.01); *H05K 2201/10151* (2013.01)  
USPC ...................................... 73/115.02

(58) Field of Classification Search  
USPC .......................................... 73/115.02, 866.5  
See application file for complete search history.

(56) References Cited

U.S. PATENT DOCUMENTS

| 5,219,795 | A | * | 6/1993 | Kumai et al. ............... 29/841 |
| 6,052,893 | A | * | 4/2000 | Yoshida et al. ............. 29/841 |
| 2009/0056446 | A1 | * | 3/2009 | Cluff et al. ............... 73/514.16 |
| 2011/0107835 | A1 | * | 5/2011 | Campbell et al. ............. 73/488 |
| 2011/0179889 | A1 | | 7/2011 | DeVolder et al. |

FOREIGN PATENT DOCUMENTS

| AT | 411 639 B | 3/2004 |
| DE | 10 2008 064 047 A1 | 4/2010 |
| DE | 10 2009 000 428 A1 | 7/2010 |
| EP | 1357774 A1 * | 10/2003 ............... H05K 3/20 |

OTHER PUBLICATIONS

German Search Report Corresponding to DE 10 2011 087 328.7.

* cited by examiner

*Primary Examiner* — Freddie Kirkland, III  
(74) *Attorney, Agent, or Firm* — Davis & Bujold, PLLC; Michael J. Bujold

(57) ABSTRACT

A method of producing an insert molded sensor assembly having at least one sensor element accommodated on a first side of a circuit board of the sensor assembly. During a first step, a plurality of pins are introduced and penetrate through the circuit board. The circuit board, including the at least one sensor element, is then disposed, during a second step, into a two-part insert mold tool so that the pins are supported on both sides of the circuit board in a direction transverse to a plane defined by the circuit board. A defined spacing distance, between a surface of the sensor element and the insert mold tool, is produced by the pins. During a third step of the method, the insert mold tool is filled with insert molding material, particularly a duroplast.

17 Claims, 4 Drawing Sheets

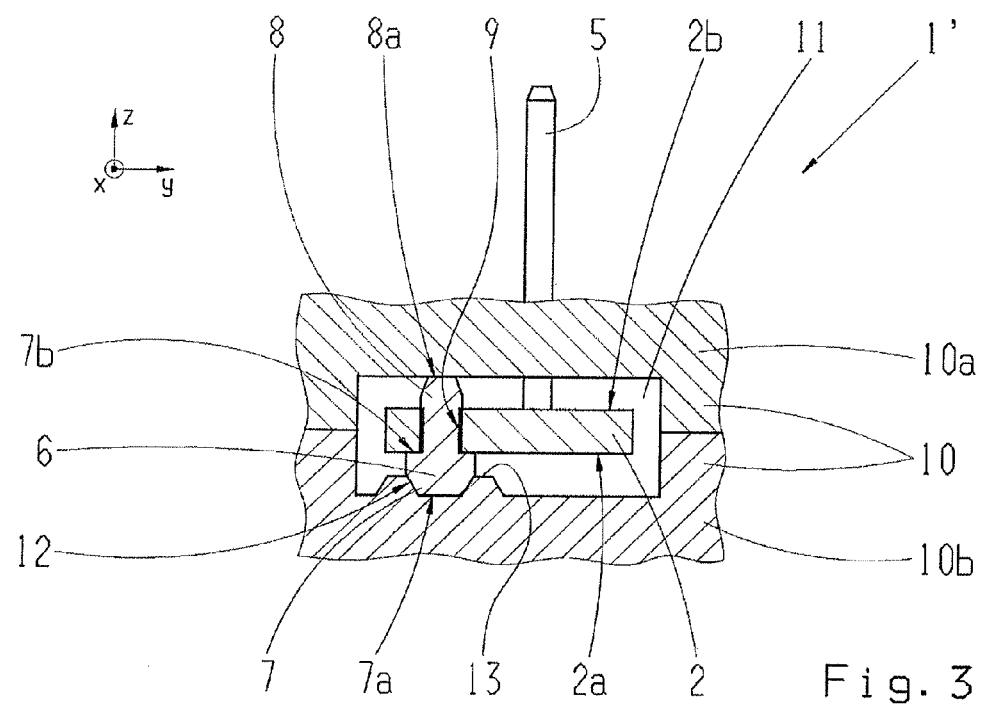

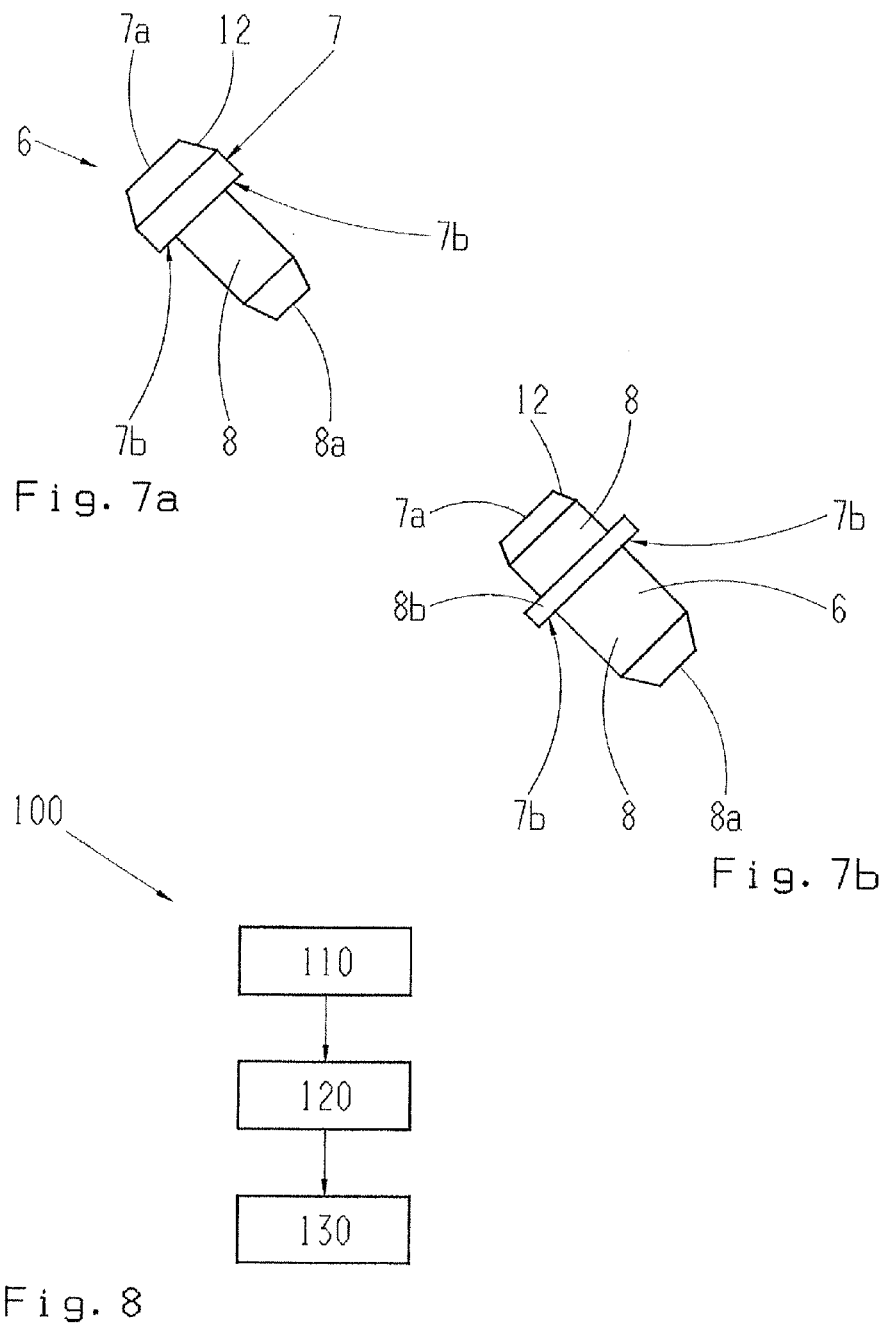

METHOD OF MANUFACTURING A MOLDED SENSOR SUBASSEMBLY

This application claims priority from German patent application serial no. 10 2011 087 328.7 filed Nov. 29, 2011.

FIELD OF THE INVENTION

The present invention relates to a method of manufacturing a molded sensor subassembly.

BACKGROUND OF THE INVENTION

In the prior art, it is known for producing a sensor, particularly a robust sensor suitable for motor vehicle applications, particularly transmission applications, to first form a premold, on which the sensing element or sensor element is accommodated, and after this, to encase, or insert mold the arrangement of the pre-mold and the sensor element together. One such procedure is shown for example in the document DE 10 2009 000 428 A1. In addition, the document DE 10 2008 064 047 A1 discloses a similar method for producing a sensor, wherein the sensor element is first insert molded, then is mechanically connected to a carrier element, and next is insert molded again together with the carrier element. These production methods are however disadvantageously extremely complex.

In the case of sensors, or sensor assemblies, which are built by means of a circuit board and measurement electronics accommodated thereon, particularly the sensor elements, the prior art likewise provides to first mount the circuit board with the electronics on a carrier, for example a pre-molded part, and then subsequently to insert mold them, wherein the circuit board with the electronics as well as the carrier are inserted into a lower tool part and covered with a further upper tool part.

Here, it is always important that as little insert molding material as possible is applied over the sensor element, which however is reliably insert molded. The sensor element should merely be covered by a thin layer of material so that the function of the sensor element and therefore of the sensor assembly is not disrupted. The circuit board with the sensor element should also be insert molded in a sealed manner.

This production process, which for producing the insert molded circuit board provides for a pre-mold and then the final insert molding, is also very complex. Furthermore, the circuit board can have significant tolerances, for example ±10%, that is, in the thickness of the material. In the course of insert molding such a circuit board in a tool, this can result in the thickness of the molding material above the sensor element fluctuating by the tolerance of the circuit board. As a result, the formed sensor assembly, particularly the sensor element, can be impaired in the function thereof.

SUMMARY OF THE INVENTION

Proceeding from this background, the problem addressed by the present invention is to overcome the disadvantages of the prior art described above, and to propose a method for producing an insert molded sensor assembly with which it is possible to insert mold, particularly sealed against media, a circuit board with sensor technology accommodated thereupon in a simple manner, and simultaneously to guarantee that the insert molding material over the sensor technology has a defined thickness and thus does not negatively affect the sensor.

A method for producing an insert molded sensor assembly, or a sensor, is proposed, wherein the sensor assembly has a circuit board and at least one sensor element received on the circuit board.

The at least one sensor element, which has a sensing means, or provides the function of the sensing means, i.e., forms the first member of the measurement chain, can for example make use of an inductive, capacitive or field sensing measurement principle, wherein alternatively or additionally, further designs are conceivable. In general, the invention can be implemented with a wide range of sensor elements.

Along with the pure sensing means, for example a Hall plate, the sensor element can have circuitry associated with the sensing means, for instance, can be formed as an integrated circuit, particularly enclosed or alternatively not enclosed, for example. The sensor element can be built for measuring rotational speed, for which purpose it is implemented as a Hall integrated circuit, for example, or can be built for other measurement tasks.

The sensor element is received, or disposed, on a first side of the circuit board of the sensor assembly, which particularly is a flat side of the circuit board. The sensor element can be, for example, soldered, adhesively bonded or disposed by other means on the circuit board, particularly in the course of a component mounting method, for example also screwed. The circuit board is preferably a temperature resistant circuit board, for instance an FR4 circuit board, that is not sensitive to the temperatures of insert molding processes; generally, an epoxy resin-based circuit board is the preferred circuit board. The circuit board can have conductor structures in a typical manner, and can for instance be populated with additional components.

The proposed method for producing the sensor assembly provides in a first step of the method that a plurality of pins, particularly metal pins, are introduced into the circuit board so as to penetrate the circuit board. With the insertion, the pins project out on both sides of the circuit board, that is, in the direction transverse to the extension plane of the circuit board.

The pins each have a shaft and preferably a head, from which this shaft extends, in particular a bolt-shaped or pin-shaped shaft. However it is also conceivable to form the pins without a head element, for instance completely bolt-shaped or pin-shaped. In order to be able to introduce the pins into the circuit board so as to penetrate the circuit board, by means of the respective shaft, there are preferably corresponding through openings in the circuit board formed transverse to the extension plane of the circuit board, that is, extending from one planar side of the circuit board to the other planar side. Through openings can be bored, laser cut, or processed by other means, with each cross-section corresponding to the shaft cross-section of the pin. The pins are preferably introduced, particularly permanently, for instance pressed, into the circuit board using advantageously simple insertion of the respective shafts into the through openings. Here it is provided to introduce the pins into the circuit board each near or adjacent to the respective sensor elements of the sensor assembly. For easy insertion, the shaft preferably has an end insertion chamfer at the end provided for the insertion.

In a second step of the method, which preferably follows the first, the circuit board including the sensor element is disposed in a particularly two-part insert mold tool. The insert mold tool preferably consists of a lower tool part and an upper tool part, which together define the cavity for the subsequent insert molding procedure.

The placement in the tool occurs in the second step such that the pins are supported in the direction transverse to the extension plane of the circuit board on both sides of the circuit board by means of a face-side contact surfaces on the insert mold tool, wherein in the following, the contact surfaces are referred to as tool contact surfaces. Here, a defined distance between a surface of the sensor element, for example a housing surface or a sensing means surface, and the insert mold tool is produced by means of the pins, as well as a defined distance from the insert mold tool to the first side of the circuit board in this regard.

This is achieved in the scope of the present invention in an advantageously simple manner, in that the circuit board with the first side thereof supports, or contacts, a further contact surface of each of the pins, which in the following is referred to as a circuit board contact surface, and which is formed particularly between the face side contact surfaces, or the ends, of the pins, particularly extending radially away from the shaft, e.g., by means of an annular flange. This is also achieved in that the circuit board contact surface herein has in particular a defined distance to each tool contact surface of the pin, which after insertion into the circuit board is adjacent to the first side of the circuit board, and by means of which support occurs on the tool adjacently to the first side.

Preferably, each circuit board contact surface is provided by a surface of a head of a pin, which is particularly shaped as a ring, facing the shaft and extending beyond it radially. Here, a tool contact surface of a pin can furthermore be formed at the head thereof, that is, at the face side of the head facing away from the shaft, and a tool contact surface can be formed at the end of the shaft of the pin facing away from the head, particularly as a planar contact surface. The tool contact surface formed at each head, after insertion of the pin into the circuit board, is disposed particularly adjacent to the first side of the circuit board, and the tool contact surface formed at each shaft is adjacent to the opposite, or second side, of the circuit board. In other words, each pin is supported at the insert mold tool on the one side with the head and the other side with the shaft.

The arrangement of the circuit board, together with the at least one sensor element received thereupon, in the tool in the second step is preferred in such a way that the respective pins with the tool contact surface which is adjacent to the first side, are supported at a first tool part particularly a lower tool part, whereas the further tool contact surface in turn is brought into contact with a second part of the tool, particularly an upper tool part. Here it is provided for example, to mount, or to dispose the circuit board, supported at the circuit board contact surface likewise disposed adjacent to the first side, in the tool, aided by gravity.

In a third step of the method, the insert mold tool is filled with insert molding material, i.e., the cavity formed by means of the tool or the tool parts, within which cavity the circuit board and the at least one sensor element are accommodated. Here, the sensor element and the circuit board are preferably insert molded together, particularly by means of a plastic injection molding, particularly by means of a single injection molding procedure. The insert molding material is particularly a duroplast, however alternatively can also be a thermoplastic, for example.

Due to the distance, defined by means of the pins, of the tool to the surface of the sensor element, an insert molding can occur advantageously with the desired material application thickness over the sensor element. Metal pins or metal pegs that permit a media-tight insert molding can be used particularly advantageously as pins. The insert molding material, particularly a thermoset, closes tightly with the metal, so that in the third step a media-tight encapsulation of the circuit board and the sensor element can be attained.

In the scope of the proposed method, it is further proposed to align or position the circuit board in the insert mold tool in the second step, which can be accomplished by means of the pins and/or additional pins. Alignment by means of the pins is provided particularly in three spatial directions, i.e., in the X, Y and Z direction. For alignment, a respective pin can form at least one positioning aid or positioning device, for example, and can be formed conically tapered, or chamfered or beveled, on the face side. Such a pin can be introduced—in the second step—for positioning in corresponding positioning receptacles in the insert mold tool, wherein particularly a self-alignment can be made possible. The corresponding positioning receptacles can be shaped as a funnel, for example.

By means of the proposed method, a sensor assembly can be produced in a simple cost-effective manner, particularly a rotational speed sensor for example, further in particular for a motor vehicle.

Further features and advantages of the invention arise from the following description of example embodiments of the invention based on the figures of the drawings which show details essential to the invention. The individual features can be implemented alone or combined in any combination in a variant of the invention.

BRIEF DESCRIPTION OF THE DRAWINGS

Preferred embodiments of the invention are explained in the following in more detail using the attached figures. The drawings show:

FIG. 3 schematically, as an example, a sectional view of a semi-finished sensor assembly in the second step of the method;

FIG. 4 schematically, as an example, a top view from above of the semi-finished sensor assembly, which was obtained in the third step of the method by means of the semi-finished sensor assembly according to FIGS. 1 and 2;

FIGS. 7a and 7b each schematically, as an example, a pin suitable for performing the method; and FIG. 8 a diagram of the method for producing an insert molded sensor assembly.

DETAILED DESCRIPTION OF THE PREFERRED EMBODIMENTS

Figure 1:
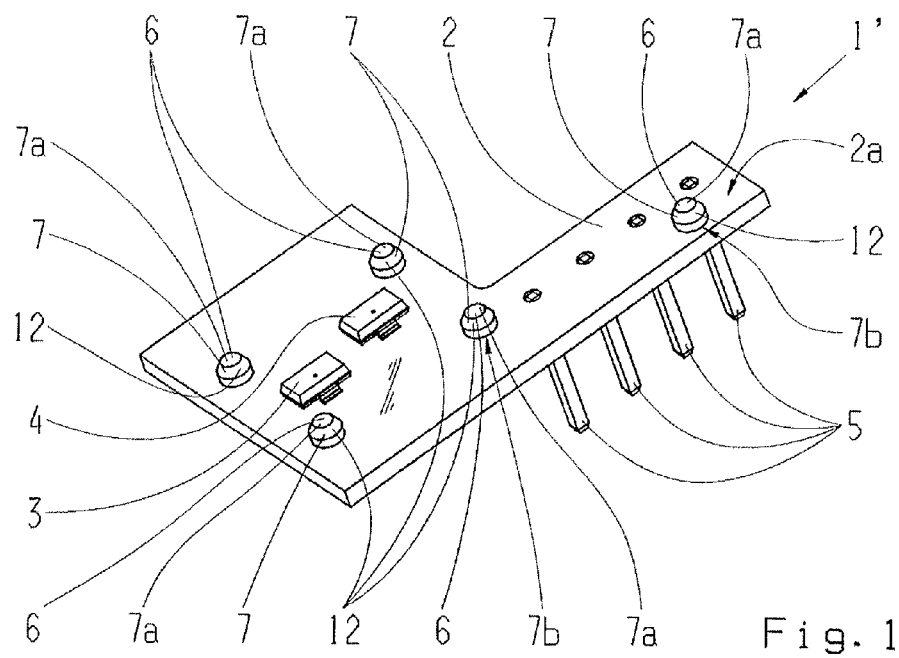
FIG. 1 schematically, as an example, a top view from above of a semi-finished sensor assembly according to the first step of the method according to a possible embodiment of the invention.

FIG. 1 shows schematically from above, as an example, a semi-finished sensor assembly 1', which is obtained in the course of the first step 110 of the method in the scope of the proposed method 100 shown in FIG. 8.

The semi-finished sensor assembly 1' has a circuit board 2 which is formed as an FR4 circuit board. A first 3 and a second 4 sensor element are received, or disposed, particularly soldered, on a first planar side 2a of the circuit board 2. The sensor elements 3, 4 are each formed as ICs, presently as Hall ICs, wherein a sensing means is disposed within the respective IC.

Figure 2:
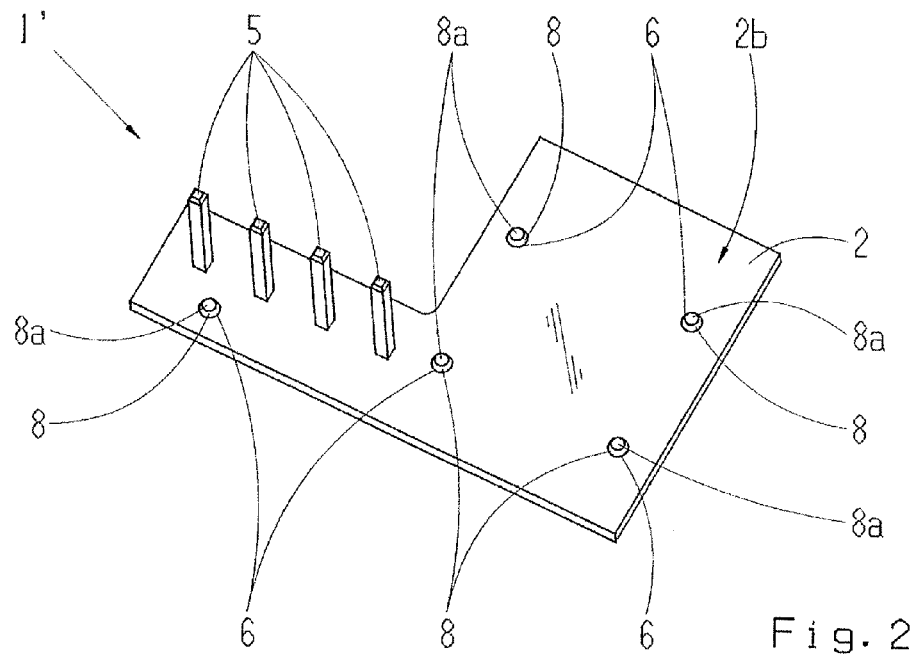
FIG. 2 schematically, as an example, the semi-finished sensor assembly from FIG. 1 from below.

Furthermore, plug contacts 5 are formed on the circuit board 2 for the purposes of connection, extending away from the underside or second planar side 2b of the circuit board, that is, transversely to the extension plane of the circuit board 2, see also FIG. 2.

For producing an insert molded sensor assembly 1, the circuit board 2 has a plurality of pins 6, particularly metal pins 6, which are or were introduced penetrating the circuit board 2 in a first step of the method. The metal pins 6 each have a head 7 and a pin-shaped shaft 8 extending away from the head 7, see also FIG. 7a, wherein the head 7 at a face side end facing away from the shaft 8 forms a first tool contact surface 7a, and the shaft 8 at the face side end facing away from the head 7 forms a further tool contact surface 8a. The tool contact surfaces 7a, 8a are each provided for support in an insert mold tool 10, for example in FIG. 3. Note that an insertion bevel is formed at the shaft end adjacent to the contact surface 8a.

In the first step 110, the metal pins 6 are inserted in corresponding bore holes, or through openings 9, which extend through the circuit board 2 transverse to the extension plane thereof, particularly adjacent to the sensor elements 3, 4. Here, the shaft 8 passes through the respective through opening 9, until the pin 6 contacts with, or is supported at a respective further, circuit board contact surface 7b at the first side 2a. The further contact surface 7b is provided by the head 7, i.e., as an annular surface facing the shaft 8 and protruding radially beyond the shaft. Alternatively, an annular flange 8b can be provided for forming the circuit board contact surface 7b, e.g., FIG. 7b.

The pins 6 also project out of the second side 2b of the circuit board 2, see FIG. 2 or FIG. 3, so that the pins can be supported likewise on the tool 10 adjacently to the second side 2b. The length of the metal pins 6 is selected such that even in the case of a maximum tolerance of the circuit board 2, a projection is still guaranteed at the second side 2b, that is, insert molding is possible on all sides of the circuit board 2.

FIG. 3 shows a sectional view of the semi-finished sensor assembly 1' according to the second step of the method 120, wherein the circuit board 2 including the sensor elements 3, 4 is disposed in a particularly two-part insert mold tool 10. Here, the insert mold tool 10 has an upper tool part 10a and a lower tool part 10b, which together form the cavity 11 receiving the semi-finished sensor assembly 1', which cavity can be filled in the third step of the method using insert molding material by means of injection molding. In the second step of the method 120, the circuit board 2 with the pins 6 is first inserted into the lower tool part 10b, wherein the pins 6 come into contact with the lower tool part 10b at a tool contact surface 7a. Then, the upper tool part 10a is placed on, wherein the pins 6 likewise come in contact at a tool contact surface 8a.

As seen in FIG. 3, in the second step 120, the circuit board 2 is disposed such that the pins 6 are supported in the direction transverse to the extension plane of the circuit board 2 on both sides of the circuit board by means of the face side tool contact surfaces 7a, 8a at the insert mold tool 10, that is, supported on one side at the upper tool part 10a and on the other side at the lower tool part 10b. As a result, a defined distance between a surface of the sensor element 3 or 4 and the insert mold tool 10 is produced by means of the pins 6, presently a defined distance of the IC housings of the sensor elements 3, 4 to the upper tool part 10a. The defined distance is set by selection of the distance between the further or circuit board contact surface 7b and the tool contact surface 7a adjacent to the first side 2a, in FIG. 3 in this regard, via the axial extension of the head 7, which is to be selected greater than the extension of the sensor element 3 or 4 on the first side 2a in the direction transverse to the extension plane of the circuit board 2. In order to keep the circuit board 2 in position in the tool 10, the circuit board can be positioned aided by gravity, for example also pressed together with the pins 6.

As seen in FIG. 3 furthermore, alignment or positioning in three spatial directions X, Y, Z is possible by means of the pins 6, for which purpose each has a positioning device 12 in the form of a conically tapered inclined section, that is, at the head 7. In the tool 10, particularly in the lower tool part 10b, positioning receptacles 13 are formed corresponding thereto, that is, funnel-shaped so that self-alignment is possible. It is provided here to use a selection of the pins 6 for positioning, see FIG. 4, ref. P, or alternatively, for example, to use all pins 6.

Figure 5:
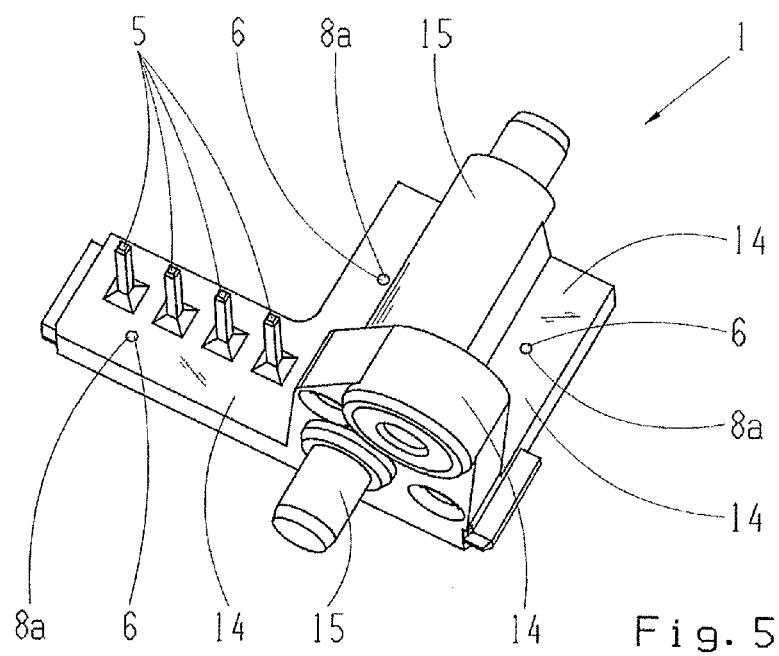
FIG. 5 schematically, as an example, a view of the sensor assembly according to FIG. 4, from below.
Figure 6:
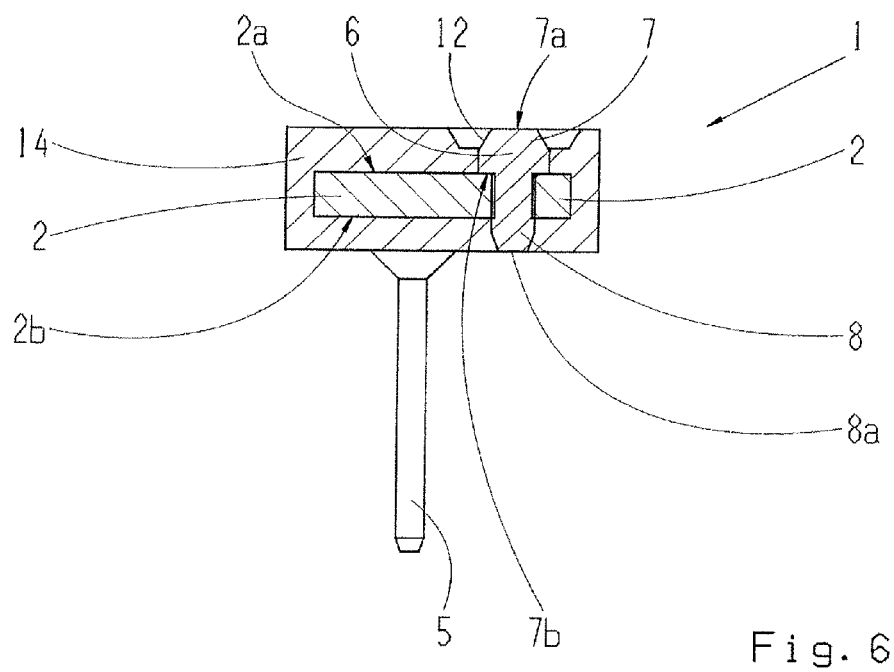
FIG. 6 schematically, as an example, a sectional view of a finished sensor assembly.

FIGS. 4 to 6 show views of the now finished sensor assembly 1, or of the sensor 1, wherein for finishing in a third step 130, the insert mold tool 10 is filled with insert molding material 14, that is, by means of injection molding, particularly with a thermoset. The finished sensor assembly 1 is removed from the tool 10 after hardening. As seen in FIGS. 4 to 6, the insert molding material 14 forms a media-tight encapsulation of the circuit board 2 and the sensor elements 3 or 4. The metal pins 6 are also encased in a sealed manner. FIGS. 4 to 6 also show further components 15 of the sensor assembly 1, that is, components that can also be insert molded in the third step 130.

By producing the intended distance between the insert mold tool 10 and the sensor elements 3, 4 in the second step 120, the insert molding material 14 has the intended thickness over the sensor elements 3, 4, so that reliable coating is guaranteed and malfunctioning is avoided.

FIG. 7b shows a further possible embodiment of a pin 6, which is formed without a head 7. In this case, an annular flange 8b is formed surrounding the shaft 8 between the tool contact surfaces 7a, 8a, which annular flange forms the circuit board contact surface 7b.

In the scope of the present invention it is possible to cost-effectively create a sensor assembly insert molded in a sealed manner using a single insert molding procedure, or the use of a single insert mold tool, with simple positioning of the circuit board, particularly in several spatial directions, and while guaranteeing reliable functioning of the sensor.

REFERENCE CHARACTERS

1', 1 sensor assembly
2 circuit board
2a first side 2
2b second side 2
3, 4 sensor element
5 plug contact
6 pin
7 head 6
7a tool contact surface 7
7b circuit board contact surface
8 shaft
8a tool contact surface 8
8b annular flange 8
9 through opening
10 tool
10a upper tool part
10b lower tool part
11 cavity
12 positioning device
13 positioning receptacle
14 insert molding material 15 component
100 method
110 first step
120 second step
130 third step
X, Y, Z spatial directions
P positioning via pin 6

The invention claimed is:

1. A method (100) of manufacturing a molded sensor subassembly (1) having at least one sensor (3, 4) supported on a first side (2a) of a circuit board (2) of the sensor assembly (1), the method comprising the steps of:
inserting a plurality of individual pins (6), during a first step, into through-bores in the circuit board until either a head or a flange of the pins contacts the first side of the circuit board such that the plurality of pins pass through the circuit board (2) and extend beyond the first side and an opposite second side of the circuit board in a direction transverse to a plane defined by the circuit board, axially opposite ends of the pins having a respective first and second tool contact surface;
arranging, during a second step, the circuit board (2) including the at least one sensor element (3, 4) and the plurality of pins (6) into a two-part insert mold tool (10) such that the first and the second tool contact surfaces (7a, 8a) of the plurality of pins (6) engage with the insert mold tool (10), and the plurality of pins (6) define a spacing distance between a surface of the sensor (3, 4) and the insert mold tool (10); and
filling the insert mold tool (10), during a third step, with insert molding material (14).

2. The method (100) according to claim 1, further comprising the step of pushing the plurality of pins through the circuit board, during the first step (110), until a circuit board contact surface (7b) of the head or the flange of a respective pin (6) abuts the first side of the circuit board.

3. The method (100) according to claim 1, further comprising the step of insert molding, during the third step, the at least one sensor (3, 4) and the circuit board (2) together.

4. The method (100) according to claim 2, further comprising the step of supporting each of the pins (6), during the second step, with the first tool contact surface (7a, 8a) abutting a lower tool part (10b) such that the circuit board (2) lies on, due to gravity, the circuit board contact surface (7b) of the head or the flange.

5. The method (100) according to claim 1, further comprising the step of either aligning or positioning, during the second step, the circuit board (2) in the insert mold tool (10) by the pins (6), in three spatial directions (X, Y, Z), in at least one of an upper tool part (10a) and a lower tool part (10b) of the insert mold tool.

6. The method (100) according to claim 5, further comprising the step of introducing at least one of the axially opposite ends of the pins (6), during the second step, into corresponding positioning receptacles (13), in at least one of the upper and the lower tool parts of the insert mold tool (10) to facilitate either aligning or positioning of the circuit board within the insert mold tool.

7. The method (100) according to claim 5, further comprising the step of bringing an upper tool part (10a), during the second step, into abutment with the second tool contact surface (8a, 7a) of each of the pins (6), such that a cavity is defined between the upper tool part and the lower tool part (10b) for the insert molding.

8. The method (100) according to claim 1, further comprising the step of forming, during the third step, a media-tight encapsulation of the circuit board (2) and the at least one sensor (3, 4) with the insert molding material (14).

9. The method (100) according to claim 1, further comprising the step of forming a circuit board contact surface (7b) with either the head (7) or the flange (8b) of the pins (6).

10. A sensor assembly for a motor vehicle transmission of a motor vehicle, the sensor assembly being produced according to a method (100) of manufacturing a molded sensor assembly (1) having at least one sensor (3, 4) supported on a first side (2a) of a circuit board (2) of the sensor assembly (1), the method comprising the steps of:
during a first step (110), introducing a plurality of individual pins (6) into through-bores in the circuit board until either a head or a flange of each of the pins contacts, the first side of the circuit board such that the plurality of pins extend through the circuit board (2) and beyond the first side and an opposite second side of the circuit board in a direction transverse to a plane defined by the circuit board, axially opposite ends of the pins have a respective first and second tool contact surface;
during a second step (210), disposing the circuit board (2) including the at least one sensor (3, 4) and the plurality of pins (6) in a two-part insert mold tool (10) such that the first and the second tool contact surfaces (7a, 8a) of the plurality of pins (6) engage with the insert mold tool (10), and the plurality of pins (6) define a spacing distance between a surface of the sensor (3, 4) and the insert mold tool (10); and
during a third step (310), filling the insert mold tool (10) with insert molding material (14).

11. A method of manufacturing an insert molded sensor assembly (1) having at least one sensor arranged on a circuit board of the sensor assembly, the method comprising the steps of:
securing the at least one sensor to an upper side surface of the circuit board,
inserting a plurality of individual elongate metal pins into through-bores in the circuit board such that the plurality of metal pins extend normal to the circuit board, each of the metal pins having a first end that comprises either a head or a flange and a second end that is opposite the first end, the head or the flange of the metal pin having an axially facing contact surface that faces the second end of the metal pin, the metal pins being inserted into the through-bores until the contact surface of the head or the flange abuts the upper side surface of the circuit board and prevents further insertion of the metal pins into the through-bores in the circuit board;
arranging the circuit board in a two-part insert mold tool such that an abutment surface of the heads or the flanges contact a lower tool part of the two-part insert mold tool to support and space the upper side surface of the circuit board from the lower tool part of the two-part insert mold tool and such that the second ends of the metal pins contact an upper tool part of the two-part insert mold tool, the metal pins supporting and spacing the circuit board at a desired distance from the two-part insert mold tool; and
filling the insert mold tool with a molding material (14).

12. The method of manufacturing an insert molded sensor assembly according to claim 11, further comprising the step of arranging the circuit board in the two-part insert mold tool such that the first ends of the pins are received within receptacles located on the lower tool part of the two-part insert mold tool so as to prevent lateral movement of the circuit board in relation to the two-part insert mold tool.

13. The method of manufacturing an insert molded sensor assembly according to claim 11, further comprising the step of defining the plurality of metal pins as being a plurality of metal pins that are independent of each other such that each of the metal pins is insertable into the through-bores in the circuit board independently of each other.

14. The method of manufacturing an insert molded sensor assembly according to claim 11, further comprising the step of uniting the at least one sensor and the circuit board prior to the step of securing the at least one sensor to the upper side surface of the circuit board, the at least one sensor being separate from the circuit board prior to the step of uniting and the step of securing the at least one sensor to the upper side of the circuit board.

15. The method of manufacturing an insert molded sensor assembly according to claim 11, further comprising the step of defining the at least one sensor as a sensor that utilizes one of an inductive, capacitive and a field sensing measurement principle.

16. The method of manufacturing an insert molded sensor assembly according to claim 15, further comprising the step of defining the at least one sensor as a rotational speed measurement sensor that is implemented as a Hall integrated circuit.

17. The method of manufacturing an insert molded sensor assembly according to claim 11, further comprising the step of either aligning or positioning the circuit board, during the second step, in the insert mold tool by setting a positioning device of the pins within positioning receptacles in the insert mold tool, the positioning device being located on at least one of the first and the second ends of the pins and the positioning receptacles being cavities that are located in at least one of the upper tool and the lower tool parts, and the positioning device of the pins being received within the positioning receptacles in the insert mold tool to facilitate alignment or positioning of the circuit board with respect to the insert mold tool in three spacial directions.

* * * * *